United States Patent [19]

Starski

[11] Patent Number: 4,557,043
[45] Date of Patent: Dec. 10, 1985

[54] COMPONENT LEAD PROCESSING APPARATUS

[75] Inventor: Wojciech Starski, Lexington, Ky.

[73] Assignee: RCA Corporation, Princeton, N.J.

[21] Appl. No.: 558,367

[22] Filed: Dec. 5, 1983

[51] Int. Cl.$^4$ .............................................. B23P 21/00
[52] U.S. Cl. ........................................ 29/741; 29/838
[58] Field of Search ................. 29/564.1, 566.3, 566.4, 29/741, 838, 839

[56] References Cited

U.S. PATENT DOCUMENTS

| | | | |
|---|---|---|---|
| 2,827,634 | 3/1958 | Kwasniewski | 1/102 |
| 2,907,040 | 10/1959 | Woods | 1/210 |
| 3,414,024 | 12/1968 | Anderson et al. | 140/1 |
| 4,153,082 | 5/1979 | Foley | 140/105 |
| 4,165,557 | 8/1979 | Taguchi et al. | 29/566.3 |
| 4,218,817 | 8/1980 | Takano | 29/741 |
| 4,464,829 | 8/1984 | Whitley et al. | 29/838 |

OTHER PUBLICATIONS

"Pin Sensor for Parts Identification," by R. T. Adsmond et al., *IBM Technical Disclosure Bulletin*, vol. 13, No. 9, Feb. 1971, p. 2619.

*Primary Examiner*—Howard N. Goldberg
*Assistant Examiner*—Timothy V. Eley
*Attorney, Agent, or Firm*—Joseph S. Tripoli; George E. Haas; William Squire

[57] ABSTRACT

A plurality of electrically conductive heads for bending the leads of components mounted on a printed circuit board are coupled to an apparatus for testing the component prior to bending and soldering the leads. The heads electrically contact the leads of the component prior to and during bending. A testing apparatus indicates that the component is present and can also test one or more electrical parameters of the component. The test apparatus indicates whether the component is good or bad prior to the bending of the component leads to facilitate replacing the component before it is soldered in place.

15 Claims, 7 Drawing Figures

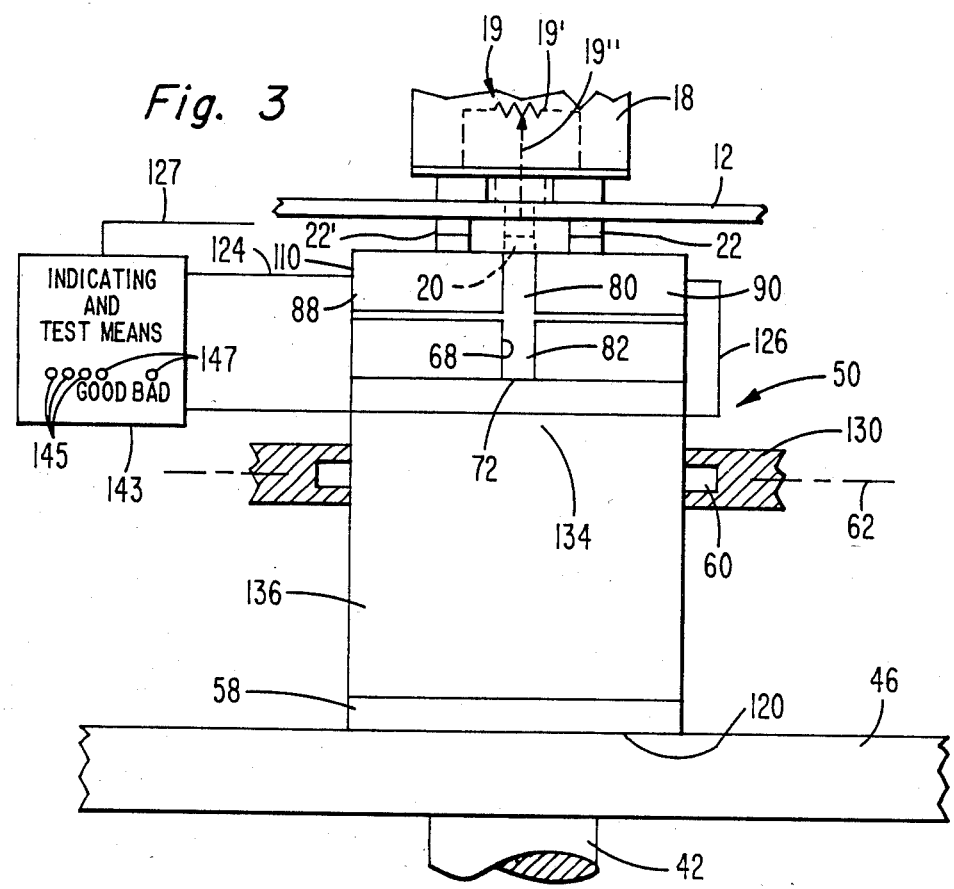
Fig. 3
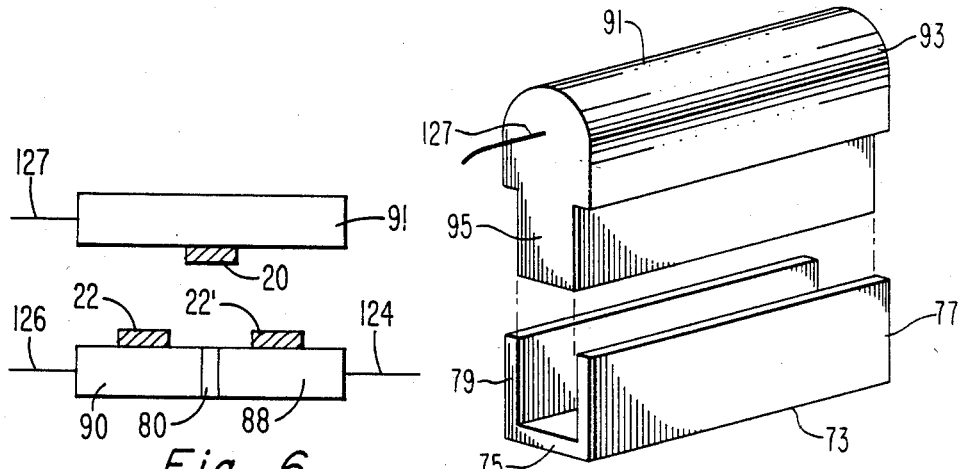
Fig. 6
Fig. 7

COMPONENT LEAD PROCESSING APPARATUS

BACKGROUND OF THE INVENTION

The present invention relates to component lead processing apparatus, and more particularly, to apparatus which can bend the leads to secure a component to a printed circuit board and detect the presence of the component on the printed circuit board.

Of interest are the following copending applications: Ser. No. 531,242, filed Sept. 12, 1983, entitled "Component Lead Processing Device," by Wojciech Starski; Ser. No. 363,960, filed Mar. 31, 1982, entitled "Multiple Component Lead Processing Apparatus," by George J. Whitley et al.; Ser. No. 302,294, filed Sept. 14, 1981, entitled "Component Lead Processing Device," by George J. Whitley et al.; Ser. No. 455,992, filed Jan. 6, 1983, entitled "Apparatus for Securing a Component to a Printed Circuit Board," by George J. Whitley; Ser. No. 469,722, filed Feb. 25, 1983, entitled "Bending Device," by Frederick W. Kopitzke, III et al.; Ser. No. 469,737, filed Feb. 25, 1983, entitled "Component Lead Bending Apparatus," by George J. Whitley et al.; and Ser. No.484,258, filed Apr. 12, 1983, entitled "Apparatus for Detecting the Presence of Components on a Printed Circuit Board," by George J. Whitley. All of the above applications are assigned to the assignee of the present invention.

As known, a printed circuit board includes numerous closely-spaced lead receiving apertures. Components may be automatically or manually assembled to the circuit board (which may be on a conveyor) by inserting component leads through the corresponding circuit board apertures. Later in the process it is required that the undersurface of the board pass over a wave soldering machine or the like which solders the protruding component leads to printed circuit board conductors. However, there is an interval between the time that component leads are inserted into the circuit board apertures and the time the circuit board passes through the soldering apparatus. During this time interval it is possible for the components to disengage from the circuit board.

Therefore, to prevent the components from becoming disengaged from the circuit board, it is desired that the protruding leads be crimped or bent over against the circuit board undersurface to preclude the leads from falling out of their corresponding apertures. Copending application Ser. No. 469,737, filed Feb. 25, 1983, mentioned above is an example of an apparatus for bending the protruding leads. Other apparatus have been employed to perform lead trimming and bending. Other examples of lead bending apparatus are disclosed in several of the above-mentioned copending applications and in U.S. Pat. Nos. 2,827,634; 3,167,779; 3,414,024; 3,574,934; 3,732,898; 4,051,593; 4,054,988; 4,153,082; 4,165,557; and 4,377,026, among others.

A problem sometimes encountered in the manufacturing process is that occasionally a component, whether inserted manually or by an automatic machine, may be inadvertently omitted. When a circuit board enters the wave soldering machine, apertures not having component leads therein become filled with solder and this makes it difficult to subsequently insert a component. It is also difficult to remove the solder from the filled apertures.

To resolve this latter problem, apparatus are employed to detect the presence of components on a printed circuit board after the lead bending operation, but prior to the soldering step. There are a number of known techniques which may be employed for detecting components on a printed circuit board. For example, U.S. Pat. No. 3,499,024 discloses a system for positioning microcircuit chips on a substrate which includes means for automatically sensing the presence of a chip. However, the system is designed to sense only a particular component of a given size and shape. It is not universally adaptable for sensing the presence of all of the different kinds of components which may be attached to the printed circuit board. For example, a disc shaped capacitor standing somewhat on edge and supported solely by relatively flexible leads would be difficult to detect. The apparatus described above could deflect the component due to the relatively flexible leads and the component presence not sensed. Further, such components come in a wide variety of sizes and may be at different heights above the printed circuit board and this adds to the difficulty of detecting them. Another example of apparatus for detecting components is shown in copending application Ser. No. 484,258 mentioned above. However, a component sensing apparatus to detect the presence of components requires a system for aligning such components to the detection apparatus. Such additional alignment apparatus adds cost and complexity to the lead processing system.

SUMMARY OF THE INVENTION

A component lead processing apparatus according to one embodiment of the present invention comprises support means for supporting and aligning a printed circuit board relative thereto. Lead bending means are coupled and aligned relative to the support means for bending an aligned lead of a component borne by the aligned printed circuit board to secure the component to the board. The lead bending means include lead contact means for electrically engaging and bending the aligned lead. Test means are coupled to the contact means for indicating at least the electrical engagement of the contact means to the aligned lead prior to the bending of that lead.

BRIEF DESCRIPTION OF THE DRAWINGS

FIG. 3 is a sectional view of the apparatus of FIG. 2 taken along lines 3—3, FIG. 6 is a plan schematic representation illustrating the spaced relationship of the leads of a component to the bending contact portions of the apparatus of FIG. 7, and FIG. 7 is an exploded view of a portion of a second bending head employed in the apparatus of FIG. 1.

DETAILED DESCRIPTION

Figures 1, 2:
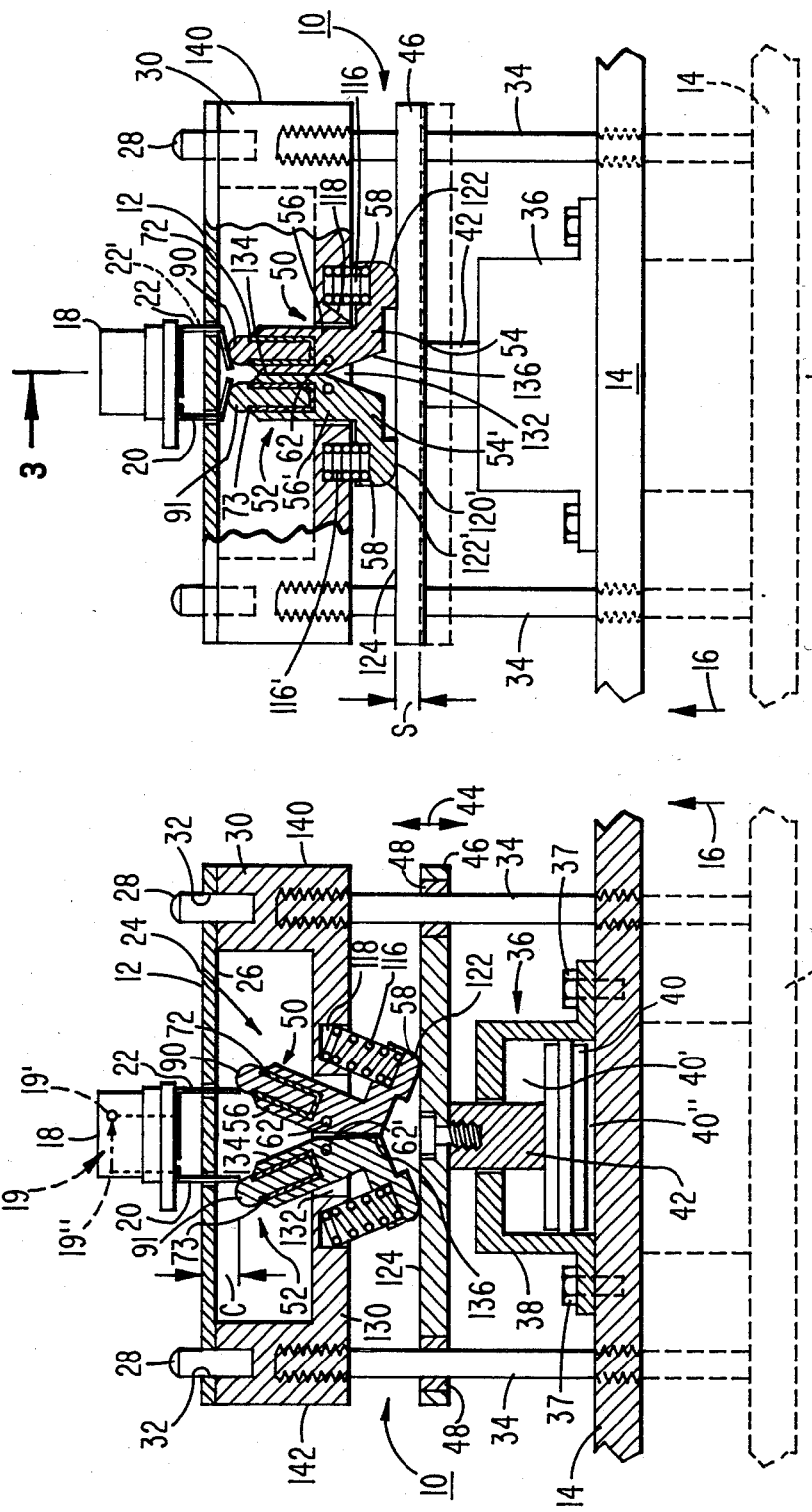
FIG. 1 is a side elevation sectional view of an apparatus prior to the lead bending step according to one embodiment of the present invention.
FIG. 2 is a partially fragmented elevation view similar to the view of FIG. 1 illustrating the completion of the component lead bending step.

In FIG. 1 apparatus 10 embodying the present invention is one which is usable on a printed circuit board conveying system such as illustrated in U.S. Pat. No.

4,377,026. In that conveying system, a conveyor is mounted in spaced relationship with respect to a floor. The conveyor, in the form of a small loop, may be one of several conveyors in the system. Means are provided for automatically transferring circuit boards from a preceding loop of the conveyor system to the one illustrated, in part, in FIG. 1, and from the one shown to the succeeding loop of the system. As these loops are not directly involved in the present invention, they will not be further described.

The conveyor transports the printed circuit board 12 in a direction, for example, from left to right in the drawing. When printed circuit board 12 reaches the component assembly station, a sensor (not shown), e.g., a microswitch or photo device, is actuated by the board, stopping the conveyor and board. Immediately therewith, the entire lead bending apparatus mounted on a support plate 14, shown in phantom, underneath the board 12, moves upward in direction 16 until the printed circuit board alignment pins 28 on apparatus 10 engage alignment apertures 32 in the circuit board 12 aligning the lead processing elements on apparatus 10 (to be described later) with the board 12 as shown in solid lines in FIG. 1. An operator (or a component inserting machine) then inserts leads 20, 22, and 22' (FIG. 3) of component 18, which may be a DIP (dual in-line package), a SIP (single in-line package), a transistor, a transformer, a resistor, a potentiometer, a capacitor, or other electrical device, through selected apertures of the printed circuit board 12.

By way of example, a three leaded potentiometer component 18 is described herein. However, the apparatus 10 may be altered as described below to process components having two leads or more than three leads. The leads 20 and 22 (and 22', FIG. 3) of the exemplary component 18 pass through corresponding apertures in the printed circuit board 12 in alignment with and electrically contacting the bending assembly 24 of the apparatus 10. Thereafter, the bending assembly 24, FIGS. 1 and 2, tests the component as will be described, and then bends the portions of the leads 20, 22, 22' extending beneath the underside 26 of the printed circuit board 12. The apparatus 10 remains in a fixed location in the conveyor system. Only the printed circuit board 12 and its components are moved by the conveyor system.

In FIGS. 1 and 3, component 18 has an internal circuit comprising a variable resistor 19 having a fixed resistor 19' connected between leads 22, 22' and a wiper 19" which couples lead 20 to a selected portion of fixed resistor 19' to selectively vary the resistance between the leads 22 and 22' and lead 20. The component 18 is defective if the resistance is the wrong value, whether due to a short circuit, an open circuit, due to misorientation of the component 18, or because component 18 is the incorrect unit. The apparatus 10 not only can bend leads 20, 22, 22', but can also test electrical parameters of the component, such as resistance in this case, to detect a defective component before its leads are bent and soldered in place. This permits the component to be easily replaced before the printed circuit board can be damaged by the soldered defective component leads, which are difficult to remove.

If the component is missing or does not test as acceptable, a visual or audible signal indicates a problem and stops the bending process. At that time an operator or another machine can remove the defective component and then replace it or insert one found to be missing.

The new component then may be tested and if it passes, the assembly 24 bends the leads of the component.

The term "test" as employed herein can include testing for the presence of a component, and component leads, testing the component for proper orientation in the circuit board and testing the component's internal circuitry for one or more electrical parameters. The testing also includes generating a signal indicative of whether or not the component passes the tests. This signal may be used to control further processing of the component (e.g. bending the leads or replacing a failed component).

The term "processing" the leads of the component, as used herein, means either the process of testing the inserted component or operation on the leads such as bending them.

After the "processing" on a given component has been completed, a second control (not shown) may then be actuated to start the conveyor moving, which brings the next printed circuit board into position for processing and which moves the completed circuit board to the succeeding conveyor loop (not shown).

In detail, the present apparatus, FIGS. 1 and 2, includes a support plate 14, which may be a relatively large plate secured to a piston (not shown) or a solenoid (not shown) for moving the plate 14 in direction 16 relative to the stationary conveyor support structure to align the circuit board 12 to pins 28. All of this action is described in more detail in the aforementioned U.S. Pat. No. 4,377,026. However, the board 12 may also be aligned by other means to pins 28, manually or automatically, while the plate 14 is held stationary.

Attached upright to the support plate 14 is an array of guides 34. The array may include four guides (only two being shown) which may be steel rods secured to plate 14 by threads. Channel support member 30 is secured (e.g., by threads) to the upper ends of the guides 34 in fixed spaced relation to plate 14.

Piston assembly 36 for operating the lead bending elements 50 and 52 of assembly 24 is secured to the upper surface of plate 14 by bolts 37. Assembly 36 includes a housing 38, a double acting piston 40 within housing 38, and a piston rod 42. Pressurized air is supplied selectively to one or the other piston chambers 40', 40" on opposite sides of the piston 40 formed by housing 38 and piston 40. This action applies a force to one or the other faces of the piston 40 in respective chambers 40', 40" to move the piston in a selected one of reciprocal directions 44, as is well known. Camming plate 46 is secured by a bolt to the extended end of piston rod 42. Plate 46 has four linear bearings 48 in an array, so that each guide 34 passes through and engages a different bearing 48. The bearings 48 closely receive the respective corresponding guides 34 to insure the plate 46 translates during its movement in directions 44 without tilting and with minimum friction. Camming plate 46 is flat and sufficiently rigid to operate the bending assembly 24 without distortion, in the manner to be described.

Figure 4:
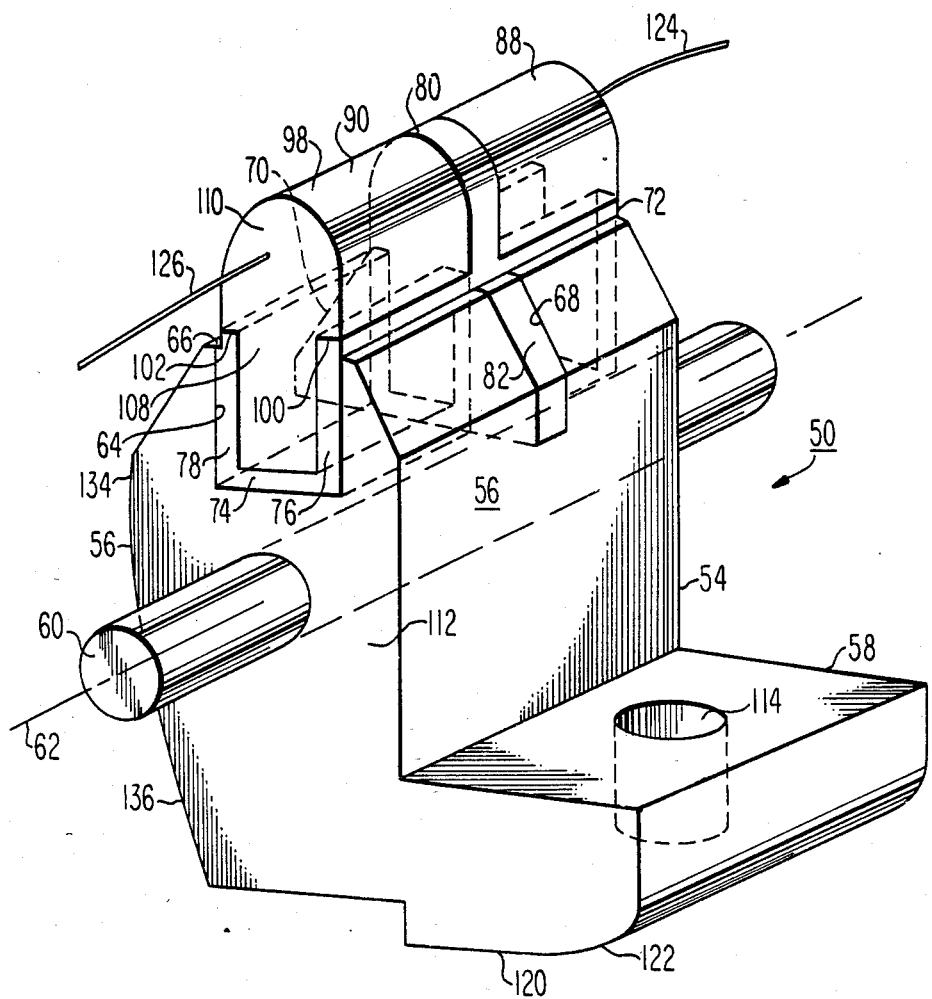
FIG. 4 is an isometric view of one of the bending heads of the apparatus of FIGS. 1 and 2.

The two bending elements 50 and 52 are of similar construction and are mounted in mirror image fashion. Portions of the following description of element 50 is representative with respect to identical components on the two elements. The primed reference numerals refer to identical parts on elements 50 and 52 having the same unprimed numbers. In FIGS. 1 and 4 element 50 includes a body 54 which may be made of metal and which may be L-shaped, having one leg 56 normal to a second leg 58. A shaft 60 passes through and is secured to the first leg 56 providing element 50 with a pivot axis 62 along the longitudinal axis of shaft 60.

A channel 64 extends across upper end 66 of leg 56 parallel to axis 62. Two coplanar channel-like recesses 68 and 70 lie in a plane transverse to axis 62 in communication with channel 64. Body 54' of element 52 is identical to body 54. In the alternative, transverse recesses 68 and 70 of body 54 may be omitted from body 54' which otherwise would be identical.

Figure 5:
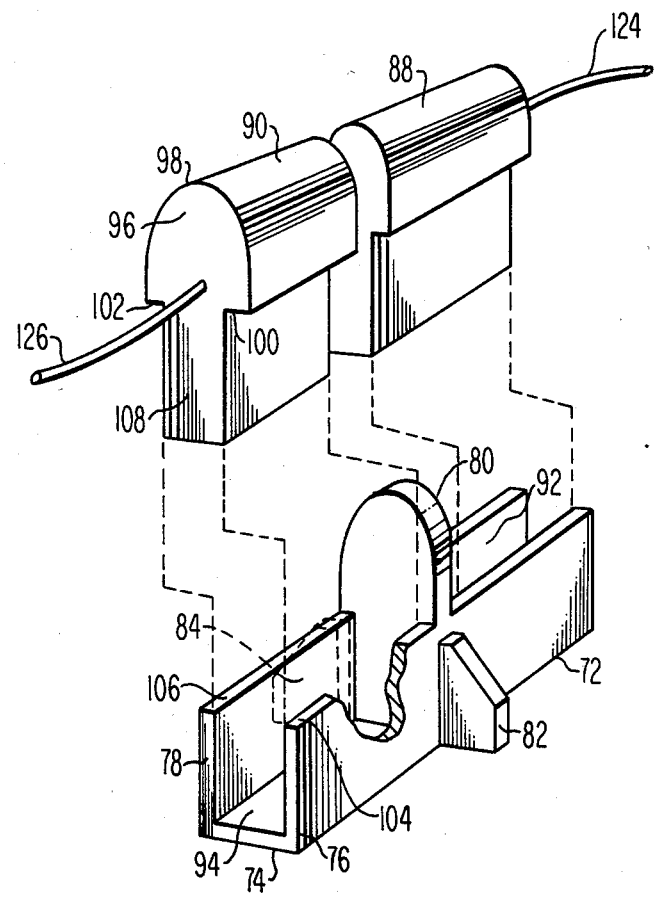
FIG. 5 is an exploded view of a portion of the bending head of FIG. 4.

In channel 64 and recesses 68 and 70 is an integral dielectric member 72. In FIG. 5 dielectric member 72 includes a bottom wall 74 and two upright parallel side walls 76, 78. An upright planar wall 80 is at the midsection of member 72. Wall 80 is coplanar with planar members 82 and 84 which extend in opposite directions from side walls 76, 78, respectively. The dielectric member 72 is closely received in and secured to the walls of channel 64 and recesses 68, 70. The upright wall 80 projects beyond the upper end 66 of element leg 56, as shown. Wall 80 divides the channel formed by walls 74, 76, and 78 into two portions forming recesses or channels 92 and 94.

In FIG. 5, the two bending heads 88 and 90 are of like construction. Head 88 is closely received in the first channel 92 on one side of upright wall 80 and head 90 is closely received in the second channel 94 on the other side of upright wall 80. The following description of bending head 90 is representative.

Bending head 90 which may be made of hardened steel includes a bending head portion 96 which may be a section of a right circular cylinder at surface 98 and which terminates at shoulders 100, 102 which rest, respectively, on the upper edges 104 and 106 of respective side walls 76, 78 of dielectric member 72. The head 90 includes a lower stem portion 108 which is closely received in second channel 94 in tight fitting relationship with facing walls 76, 74, 78, and 80 of the dielectric member 72. The stem portion 108 is sufficiently tight fitting in the second channel 94 such that there is negligible play or movement of the bending head 90 relative to the dielectric member 72.

The dielectric member 72 is made of hard rigid material capable of withstanding bending forces transmitted from bending head 90 to the leg 56 of bending element 50, FIG. 4. By way of example, the dielectric member 72 may be made of high strength dielectric thermoplastic material such as an epoxy adhesive, an acrylic material, Delron or Nylon (trademarks of E. I. DuPont de Nemours & Company, Inc.). Delron and Nylon are materials which are commonly used in machine parts such as shafts, gears, and other elements normally used to transmit loads from one component to another. The epoxy adhesive may be applied as a liquid to the interfacing surfaces of heads 88, 90 and leg 56. The adhesive after curing in place forms the dielectric member. The dielectric member 72 performs similarly as a hard tool steel element. It is used in the present apparatus to take advantage of its dielectric properties. As shown in FIG. 4, the end surface 110 of the bending head 90 is flush with the ends of walls 74, 76, 78 of dielectric member 72 and surface 112 of leg 56.

The composite leg 56 structure includes the two bending heads 88 and 90, and the dielectric member 72, which together form an integral relatively rigid lead bending member for bending the protruding component leads, e.g., leads 22, 22'.

The other leg 58, FIG. 4, of element 50 includes a circular cylindrical recess 114 for receiving a compression spring 116, FIG. 1. Compression spring 116 has one end abutting leg 58 in the recess 114 and the other end abutting member 30 in recess 118, FIG. 1, in the undersurface of channel support member 30. Undersurface 120 of leg 58 is curved at edge 122 to provide a cam follower surface. Edge 122 abuts upper surface 124 of camming plate 46, FIG. 1, in the idle position. Because the dielectric member 72 is between bending heads 88 and 90, FIG. 4, and the mating surfaces of leg 56 of element 50, both heads 88 and 90 are electrically isolated from leg 56. A wire 124 is ohmically connected to head 88 and wire 126 is ohmically connected to head 90 such as by soldering or the like.

The dielectric member 73 of the element 52, FIGS. 1 and 7, is channel-shaped, somewhat like member 72, FIG. 5. Member 73, however, does not have a wall 80 or planar members 82, 84 of member 72, and therefore, is a straight channel member having a bottom wall 75 and two side walls 77, 79. Member 73 is closely received in and secured to the walls of the channel of element 52, body 54' corresponding to channel 64, body 54, FIG. 4.

Bending head 91 of element 52, FIG. 7, has a semicylindrical bending portion 93 similar in shape as bending head 90 portion 96, FIG. 5, and a stem portion 95 similar to stem portion 108 of head 90. Head 91 may have, for example, the same construction as heads 88 or 90, FIG. 4, but of greater length in a direction parallel to axis 62 so that the head 91 ends and the ends of mating dielectric number 73 are flush with the corresponding ends of leg 56' of body 54'. Stem portion 95, FIG. 5, fits tightly in and is secured to the walls of the channel of member 73. Member 73 may be made of the same material as member 72. A wire 127 is ohmically connected to head 91. Head 91 is thus electrically isolated from the remaining portion of element 52 to which it is attached.

The support member 30, FIG. 1, is channel shaped and includes a plate 130 having an aperture 132 for receiving elements 50 and 52, legs 56. The shaft 60 of element 50, FIG. 4, and corresponding shaft of element 52 are pivotally mounted in corresponding bearing apertures in plate 130, FIG. 1. In FIGS. 1 and 2, the elements 50 and 52 are secured in back-to-back mirror image fashion via their shafts 60 so that the outer surface 134 of the leg 56 (and surface 134' of leg 56'), FIG. 4, are facing and may abut after completing the bending operation, FIG. 2, and surfaces 136 and 136' are facing and may abut in the idle position, FIG. 1, prior to the bending step.

The support member 30, FIG. 1, includes two parallel upright legs 140 and 142 at opposite edges of the plate 130. Guide pins 28 are secured to the upper portions of the walls 140, 142. Guides 34 are secured to the plate 130 and walls 140, 142, as shown.

The electrical component 18 which is being tested, FIG. 3, has all its leads 20 (shown in phantom in FIG. 3 to illustrate its relative position), 22, and 22' thereof electrical connected to test equipment 143. One lead 20 is on one side of the component, FIGS. 1 and 6, and two leads 22, 22', FIGS. 1, 3 and 6, are on the other side of the component. Only two leads are shown in FIGS. 1 and 2; the other lead 22' being hidden by lead 22, as seen in FIG. 6. Lead 20 conductively contacts head 91 of element 52, lead 22 contacts head 90, and lead 22' contacts head 88. The test equipment 143 is connected to the bending heads 88, 90, and 91 by wires 124, 126, and 127, respectively.

The details for such test equipment are not given herein because such apparatus are well known and can be constructed by one of ordinary skill in the test equipment art. The sophistication of the test apparatus depends on the need of a given implementation. For example, the test equipment 143 may include in one mode a simple continuity tester comprising a power source (not shown) and light bulbs 145, FIG. 3, coupled to the power source through two or more of wires 124, 126, and 127. When the circuit to any two wires 124, 146, and 127 is closed one of light bulbs 145 illuminates. A sufficient number of bulbs 145 may be provided to indicate continuity between such wire pairs. For example, for a three lead component three bulbs 145 may be used. It should be understood that the illustrative embodiment of "bulbs" is exemplary and other indicators, e.g., LCD displays, LED devices, audio alarms may be used as indicators in equipment 143. In an alternate test mode, the component 18 may be tested for a given parameter, such as resistance or capacitance, via the connections to the component leads 20, 22, and 22'. In the Figures herein, where the component 18 is a potentiometer, the test equipment could include an ohmmeter. The test equipment 143 may have a comparator circuit for comparing the value of the measured resistance to a reference resistance value. If the comparison is acceptable, the "good" bulb of bulbs 147 is lit, otherwise the "bad" bulb is lit. This also automatically tests for proper component orientation.

In operation, the apparatus 10, FIG. 1, is in its initial idle position. In this position the compression springs 116 have tilted the elements 50 and 52 against the camming plate 46. The piston 40 at this time is in the lowermost retracted position. As already explained above, the position of the various portions of the apparatus 10 of FIG. 1 are shown after the support member 14 is raised in direction 16 so that the guide pins 28 are engaged with the alignment apertures 32 on the printed circuit board 12. The camming surfaces 122 of the elements 50, 52, are in abutting engagement with the upper surface 124 of the camming plate 46. The facing surfaces 136 of the elements 50, 52, may abut. The leads 20, 22, and 22' of the component 18 to be bent electrically engage or contact the corresponding bending heads of elements 50, 52. Clearance C, FIG. 1, between the upper edges of the bending heads and the lower surface of the printed circuit board 12 is set by means (not shown) so that the bending heads are in a position to contact and bend inserted the component leads 20, 22, and 22'.

Test equipment 143 now provides an indication of whether the component 18 is acceptable, i.e., passes the continuity and/or parameter value test. If acceptable, the lead "processing" continues. If unacceptable, a warning is sounded or indicated and the problem corrected. The process is repeated if a defective component is replaced. If the new component is acceptable, its leads are then bent.

In the bending portion of the process, the piston assembly 36 is operated to move the piston rod 42 in direction 16, FIG. 1. This results in a stroke S of the camming plate 46, FIG. 2. The camming plate 46 engages the camming surfaces 122 of the elements 50, 52, rotating the elements in opposite mirror image fashion about their corresponding parallel axes 62. The bending heads 88, 90, and 91 bend the respective leads of the component 18 to the position shown, FIG. 2. At this point the element legs 56 and 56', are vertical and the facing legs 56 and 56' surfaces 134, 134', FIG. 4, abut.

The lower surfaces 120 and 120' of the legs 58, 58' of the bending elements abut the camming surface 124 of plate 46. The bending heads 88, 90, and 91 of the bending elements are in ohmic contact with the various leads of the inserted component 18 at the initial position just prior to bending, FIG. 1, during and after bending, FIG. 2, and, therefore, can provide a continuous indication of the presence and test of the component via the test equipment 143.

The test equipment 143 is particularly useful when a large number of components are present on a printed circuit board. In that case, it is not as easy for an operator to immediately ascertain that a component is missing, has not been properly inserted, or is "bad." For a large plurality of leads, the bending elements may have a greater plurality of corresponding bending heads, each electrically coupled to the test equipment 143. It is not essential that there be a corresponding equal number of bending heads as there are leads in a component. In certain instances, the system can be constructed to indicate that all leads are presented and being bent. Separate indicating means, such as bulbs 145, can be provided for each lead pair (or lead set) being bent; or bulbs 147 for each parameter under test.

What is claimed is:

1. A component lead processing apparatus comprising:

support means for supporting and aligning a printed circuit board relative thereto;

lead bending means coupled and aligned relative to the support means for bending a lead of a component borne by the aligned printed circuit board to secure the component to the board, said lead bending means including lead contact means for electrically engaging and bending said lead; and test means coupled to said lead contact means for indicating at least the electrical engagement of the lead contact means to said lead prior to the bending of that lead;

said lead bending means comprising a support member, a pair of metal bodies pivotally secured to the support member, dielectric means secured to the bodies, and at least two metal bending heads secured to said dielectric means, said dielectric means being sufficiently hard and durable to transfer the bending forces induced by said bending substantially to said bodies from said bending heads.

2. The apparatus of claim 1 wherein said lead bending means comprises a body secured for rotation relative to said support means, said contact means including an electrically conductive bending head secured to said body in electrical isolation from said support means, said bending means further including means for moving said body and head relative to said support means from an idle position to a lead bending position.

3. The apparatus of claim 2 wherein said body includes a plurality of said bending heads, each head in electrical isolation from each other and from said support means, each head corresponding to a different lead of said component.

4. The apparatus of claim 2 wherein said lead bending means comprises a pair of said bodies, said contact means includes a bending head secured to each body of said pair, said bending heads being positioned in said support means for engagement with a corresponding aligned lead of the component.

5. An apparatus for bending a plurality of leads of a component borne by a printed circuit board to secure the component to the board and for indicating the presence of the secured component on the board comprising:

support means;

means coupled to the support means for aligning the printed circuit board relative to the support means;

bending means secured to the support means and aligned relative to said plurality of leads when said board is aligned, said bending means including movable drive means and at least first and second electrically conductive bending heads secured to said drive means, said drive means including means for electrically isolating said first and second bending heads, each head being located on said drive means for bending a corresponding lead in response to the movement of the drive means from an idle position to a bend position, each said head being adapted to be in electrical contact with said corresponding lead during said bending;

means coupled to the support means for moving said drive means; and means electrically coupled to said bending heads for indicating said electrical contact with said lead and thereby the presence of said component;

said drive means including a drive member having a channel, dielectric means in said channel having first and second spaced recesses, said first head being in said first recess, said second head being in said second recess.

6. The apparatus of claim 5 wherein said drive means includes a pair of driving members, said first bending head being attached to one of said driving members, the second bending head being attached to the other of said driving members, said dielectric means being coupled to said members for electrically isolating said bending heads from each other and said support means.

7. The apparatus of claim 5 wherein said drive means includes first and second drive members secured for rotation about parallel axes, said means coupled to the support means for moving the drive means including means adapted for sequentially rotating said drive members in opposite directions.

8. The apparatus of claim 7 wherein said drive members are L-shaped, one leg of each drive member including spring means coupled to said support means for urging said drive members in said idle position and further including a cam follower, the other leg of each drive member including a bending head, at least one head on each drive member, said means for moving the drive means including cam means engaged with the cam follower of each drive member.

9. The apparatus of claim 8 wherein said cam means includes a support plate and piston means secured to said plate, said support plate including means for reciprocally moving said plate relative to and in engagement with said cam followers.

10. Apparatus for securing a component to a printed circuit board and for testing a given electrical parameter of the component comprising:

a support adapted to releasably secure a printed circuit board lying in a plane, said board carrying a component having first and second leads, which, when bent, secure the component to the board, said elements being electrically connected internal to said component, said internal connection exhibiting said electrical parameter having a given value;

a pair of drive members secured to said support for rotation about a respective pair of corresponding axes;

means secured to the support for rotating said drive members about their respective axes;

first and second electrically conductive element bending heads, one head being secured to one of said drive members and the other head to the other drive member, said heads moving adjacent said plane in contact with and for bending said elements, when present, in response to the rotation of said members;

dielectric means coupled to said heads for electrically isolating said heads from the corresponding members; and test means connected to said heads and responsive to the engagement of said heads with said elements to test said component;

said dielectric means including a pair of dielectric members each having a channel, each said drive members including a recess for receiving a corresponding dielectric member, a different bending head being received in the channel of a corresponding dielectric member.

11. The apparatus of claim 10 wherein said test means includes means for comparing said component internal parameter to a reference for indicating whether said compared parameter value is acceptable.

12. The apparatus of claim 10 wherein said heads are positioned on said support at a location to initially contact said elements when present to thereby test said component prior to said bending.

13. A printed circuit board component processing apparatus comprising:

a support;

means for aligning a printed circuit board relative to the support;

first and second members secured to said support for movement relative to said support, said members each including a drive element and a component lead bending element adapted to bend the corresponding leads of a component on said aligned printed circuit board in response to said movement, each said bending element including a bending head secured in electrical isolation, said heads being located for engaging said corresponding lead to be bent, said engagement providing bending and electrical contact between said corresponding lead and head;

means secured to the support and engaged with said drive element for moving said members and thereby bending said leads; and test means connected to said bending heads for indicating at least said electrical contact between said leads and heads;

each said bending element including a channel, a dielectric element in said channel having at least one recess, said bending head being located in said recess, said dielectric element being between said head and said bending element, said dielectric element being sufficiently rigid so that forces for bending said lead are substantially transmitted from said bending head to said bending element through said dielectric element.

14. The apparatus of claim 13 further including at least two bending heads, each in a corresponding recess, said dielectric element including means for electrically isolating each said two bending heads, said test means being coupled to all said heads.

15. The apparatus of claim 13 wherein said component includes an internal circuit between said leads, said internal circuit exhibiting at least one electrical parameter of a given value, said test means including means for comparing said parameter value to a reference value and for indicating the acceptability of said component based on said comparison.

* * * * *